United States Patent
Kim et al.

(10) Patent No.: US 12,256,489 B2
(45) Date of Patent: Mar. 18, 2025

(54) CIRCUIT BOARD INCLUDING A BUFFER LAYER FOR IMPROVING

(71) Applicant: LG INNOTEK CO., LTD., Seoul (KR)

(72) Inventors: Yong Suk Kim, Seoul (KR); Jeong Han Kim, Seoul (KR); Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 192 days.

(21) Appl. No.: 17/928,703

(22) PCT Filed: Jun. 10, 2021

(86) PCT No.: PCT/KR2021/007255
§ 371 (c)(1),
(2) Date: Nov. 30, 2022

(87) PCT Pub. No.: WO2021/251763
PCT Pub. Date: Dec. 16, 2021

(65) Prior Publication Data
US 2023/0240005 A1    Jul. 27, 2023

(30) Foreign Application Priority Data

Jun. 12, 2020 (KR) .................. 10-2020-0071606

(51) Int. Cl.
*H05K 1/02* (2006.01)
*H05K 1/11* (2006.01)

(52) U.S. Cl.
CPC .......... *H05K 1/0296* (2013.01); *H05K 1/115* (2013.01)

(58) Field of Classification Search
CPC ............... H05K 1/0296; H05K 1/115
USPC ........................................... 174/256
See application file for complete search history.

(56) References Cited

U.S. PATENT DOCUMENTS

| | | | |
|---|---|---|---|
| 3,652,332 A * | 3/1972 | Brand | H05K 1/0386 427/125 |
| 6,117,536 A | 9/2000 | Poutasse | |
| 8,853,557 B2 | 10/2014 | Yugawa | |
| 10,385,076 B2 * | 8/2019 | Mori | A61K 31/53 |
| 10,763,002 B2 | 9/2020 | Matsuura | |
| 2004/0237295 A1 | 12/2004 | Wakizaka et al. | |
| 2017/0334933 A1 | 11/2017 | Mori et al. | |
| 2017/0347450 A1 | 11/2017 | Park | |
| 2019/0116663 A1 * | 4/2019 | Findley | H05K 3/4688 |
| 2020/0377767 A1 | 12/2020 | Hirai et al. | |

FOREIGN PATENT DOCUMENTS

| | | |
|---|---|---|
| JP | H8-143688 | 6/1996 |
| JP | 2006-253185 | 9/2006 |
| JP | 2011-199249 | 10/2011 |
| KR | 10-2004-0062536 | 7/2004 |
| KR | 10-0493220 | 6/2005 |
| KR | 10-2015-0006457 | 1/2015 |
| KR | 10-2017-0116129 | 10/2017 |
| KR | 10-2017-0133996 | 12/2017 |
| KR | 10-2020-0037803 | 4/2020 |

OTHER PUBLICATIONS

International Search Report dated Sep. 27, 2021 issued in Application No. PCT/KR2021/007255.
Japanese Office Action dated Sep. 3, 2024 issued in Application No. 2022-575817.
Korean Office Action dated Oct. 24, 2024 issued in Application No. 10-2020-0071606.

* cited by examiner

*Primary Examiner* — Timothy J Thompson
*Assistant Examiner* — Michael F McAllister
(74) *Attorney, Agent, or Firm* — KED & ASSOCIATES, LLP (57) ABSTRACT

A circuit board according to an embodiment comprises: an insulation layer; a circuit pattern disposed on the upper surface or under the lower surface of the insulation layer; and a buffer layer disposed on at least one surface of the upper surface and the lower surface of the insulation layer, wherein the buffer layer includes carbon, nitrogen, and oxygen, the ratio of the nitrogen to the carbon ((carbon/nitrogen)*100) is 5 to 15, and the ratio of the oxygen to the carbon ((carbon/oxygen)*100) is 15 to 30.

15 Claims, 7 Drawing Sheets

CIRCUIT BOARD INCLUDING A BUFFER LAYER FOR IMPROVING

CROSS-REFERENCE TO RELATED PATENT APPLICATIONS

This application is a U.S. National Stage Application under 35 U.S.C. § 371 of PCT Application No. PCT/KR2021/007255, filed Jun. 10, 2021, which claims priority to Korean Patent Application No. 10-2020-0071606, filed Jun. 12, 2020, whose entire disclosures are hereby incorporated by reference.

TECHNICAL FIELD

The present invention relates to a circuit board.

BACKGROUND ART

A printed circuit board (PCB) is formed by printing a circuit line pattern at an electrical insulating substrate with a conductive material such as copper, and thus the PCB refers to a board just before electronic components are mounted thereon. That is, in order to densely mount various types of electronic components on a planar surface, the PCB refers to a circuit board having a planar surface on which a mounting position of each component is fixed and a circuit pattern connecting the components is fixedly printed.

In general, as a surface processing method for a circuit pattern included in the above-described PCB, an organic solderability preservative (OSP) method, an electrolytic nickel/gold method, an electrolytic nickel/gold-cobalt alloy method, an electroless nickel/palladium/gold method, etc. Are used.

In this case, the above-described surface processing methods vary depending on a use thereof, and the use includes, for example, soldering, wire bonding, and a connector.

Components mounted on the printed circuit board may transmit signals generated from the components by circuit patterns connected to the components.

Meanwhile, recently, with advancement of functionality in portable electronic devices and the like, high-frequency of signals are in progress in order to perform high-speed processing of a large amount of information, and a circuit pattern of a printed circuit board suitable for high-frequency applications is required.

Efforts are being made to reduce the circuit pattern spacing and line width in the printed circuit boards for high-frequency applications.

In order to reduce the pattern spacing and line width, a strong adhesive force between the circuit pattern and the insulating layer is required, and reliability can be improved while reducing the spacing and line width of the circuit pattern by increasing the adhesive force.

Therefore, there is a need for a printed circuit board having a new structure capable of improving the adhesion of the circuit pattern.

DISCLOSURE

Technical Problem

An embodiment is directed to providing a circuit board having improved reliability and density by improving adhesion between an insulating layer and a circuit pattern.

Technical Solution

A circuit board according to an embodiment includes: an insulating layer; a circuit pattern disposed on an upper surface or under a lower surface of the insulating layer; and a buffer layer disposed on at least one of on the upper surface and under the lower surface of the insulating layer, wherein the buffer layer includes carbon element, nitrogen element and oxygen element, wherein a ratio of the nitrogen element to the carbon element ((carbon element/nitrogen element)*100) is 5 to 15, wherein a ratio of the oxygen element to the carbon element ((carbon element/oxygen element)*100) is 15 to 30.

A circuit board according to an embodiment includes: a circuit pattern disposed on an upper surface or under a lower surface of the insulating layer; and a buffer layer disposed on at least one of on the upper surface of the insulating layer, under the lower surface of the insulating layer and on an inner surface of the via, wherein the buffer layer includes carbon element, nitrogen element and oxygen element, wherein a ratio of the nitrogen element to the carbon element ((carbon element/nitrogen element)*100) is 5 to 15, wherein a ratio of the oxygen element to the carbon element ((carbon element/oxygen element)*100) is 15 to 30.

Advantageous Effects

A circuit board according to the embodiment may improve adhesion between the insulating layer and the circuit pattern. In detail, the adhesion between the first layer formed of copper among the plating layers of the circuit pattern and the insulating layer may be improved.

Accordingly, a spacing and line width of the circuit pattern may be reduced.

That is, even if the thickness or line width of the circuit pattern is reduced, a support force of the circuit pattern can be secured by the adhesion between the first layer of the circuit pattern and the insulating layer, thereby the circuit pattern with a fine line width and a fine spacing can be implemented.

Accordingly, since the circuit board according to the embodiment may improve the density of circuit patterns, more circuit patterns may be disposed in the same area and the size of the circuit patterns may be reduced.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively bonded and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be bonded in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "bonded", or "connected" to another element, it may include not only when the element is directly "connected" to, "bonded" to, or "connected" to other elements, but also when the element is "connected", "bonded", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a circuit board according to an embodiment will be described with reference to drawings.

Figure 1:
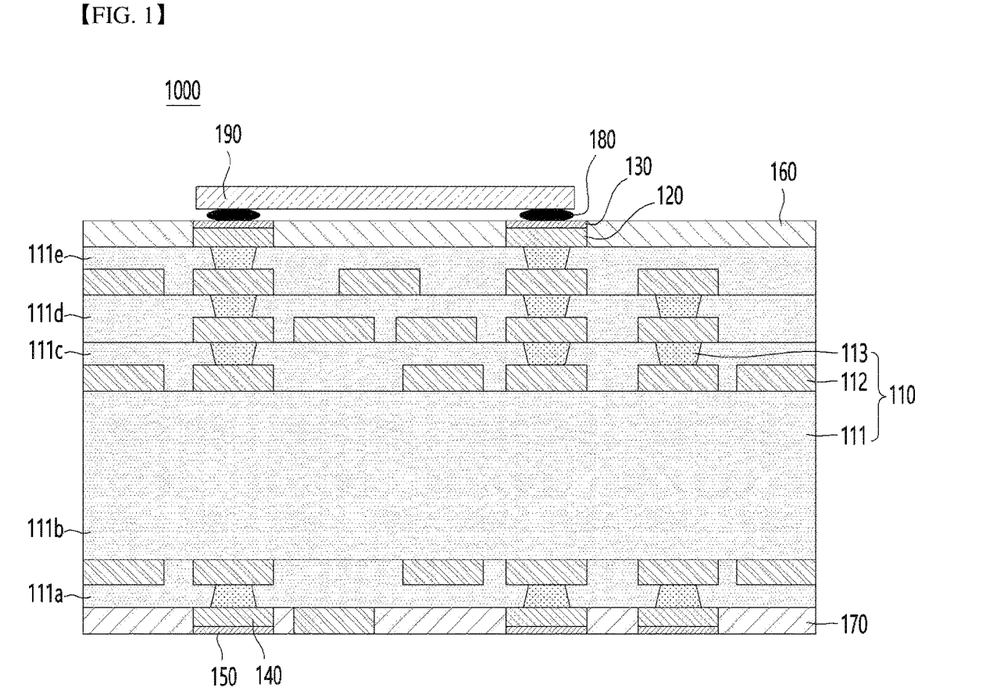
FIG. 1 is a cross-sectional view of a circuit board according to an embodiment.

Referring to FIG. 1, a circuit board according to an embodiment may include an insulating substrate 110, a first pad 120, a first upper metal layer 130, a second pad 140, a second upper metal layer 150, a first passivation layer 160, a second passivation layer 170, a solder paste 180, and an electronic component 190.

The insulating substrate 110 may have a flat plate structure. The insulating substrate 110 may be a printed circuit board (PCB). Here, the insulating substrate 110 may be implemented as a single substrate, and alternatively, may be implemented as a multilayer substrate in which a plurality of insulating layers are sequentially stacked.

Figure 2:
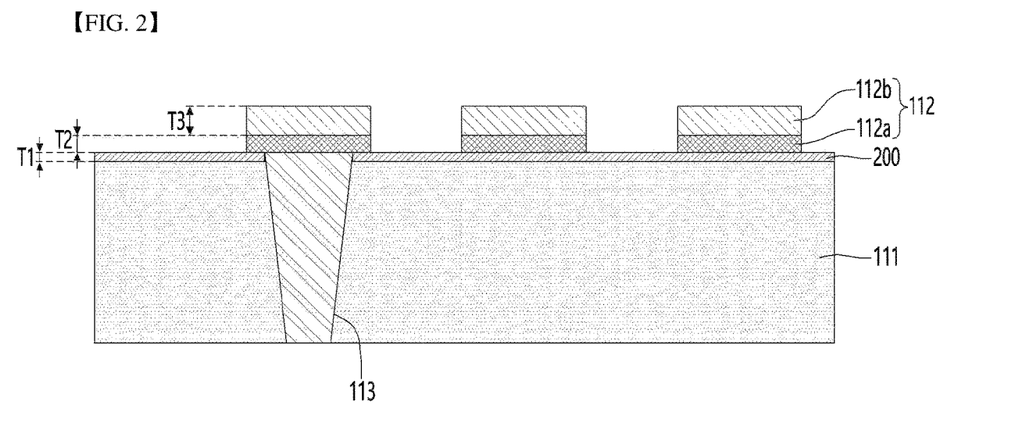
FIG. 2 is a cross-sectional view of one region of the circuit board according to the first embodiment.

Accordingly, the insulating substrate 110 includes a plurality of insulating layers 111. As shown in FIG. 2, the plurality of insulating layers 111 may include a first insulating layer 111a, a second insulating layer 111b, a third insulating layer 111c, a fourth insulating layer 111d, and a fifth insulating layer 111e from an uppermost portion. In addition, a circuit pattern 112 may be disposed at each of surfaces of the first to fifth insulating layers. That is, the circuit pattern 112 may be disposed on at least one of both surfaces of the first to fifth insulating layers.

The plurality of insulating layers 111 is a substrate on which an electrical circuit capable of changing wirings is disposed and may include all of printing, a wiring plate, and an insulating substrate which are formed of an insulation material which is able to form the circuit pattern 112 at a surface of the insulating layer.

At least one insulating layer among the plurality of insulating layers 111 may include prepreg including glass fiber. In detail, at least one insulating layer among the plurality of insulating layers 111 may include an epoxy resin and a material in which glass fiber and silicon-based filler are dispersed in the epoxy resin.

Alternatively, at least one insulating layer among the plurality of insulating layers 111 may include resin coated Cu (RCC). The resin coated Cu (RCC) is a resin coated on copper foil without glass fiber, and since it does not contain glass fiber, a permittivity of the insulating layer can be reduced.

In addition, at least one insulating layer among the plurality of insulating layers 111 may be rigid or flexible. For example, the insulating layer 111 may include glass or plastic. Specifically, the insulating layer 111 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the insulating layer 111 may include an optically isotropic film. As an example, the insulating layer 111 may include cyclic olefin copolymer (COC), cyclic olefin polymer (COP), optically isotropic PC, optically isotropic polymethylmethacrylate (PMMA), etc.

Further, the insulating layer 111 may be partially bent while having a curved surface. That is, the insulating layer 111 may partially have a plane and may partially be bent while having a curved surface. Specifically, an end portion of the insulating layer 111 may be bent while having a curved surface, or bent or crooked while having a surface with a random curvature.

Furthermore, the insulating layer 111 may be a flexible substrate having flexibility. Further, the insulating layer 111 may be a curved or bent substrate. In this case, the insulating layer 111 may represent a wiring layout for electrical wirings which connect circuit components based on a circuit design, and electrical conductors may be disposed on an insulation material. Furthermore, electrical components may be mounted on the insulating layer 111, and the insulating layer 111 may form wirings configured to connect the electrical components to make a circuit, and may mechanically fix the components besides functioning to electrically connect the components.

Each of the circuit patterns 112 is disposed at the surface of the insulating layer 111. The circuit pattern 112 may be a wiring for transmitting an electrical signal, and may be formed of a metal material having high electrical conductivity. To this end, the circuit pattern 112 may be formed of at least one metal material selected from among gold (Au), silver (Ag), platinum (Pt), titanium (Ti), tin (Sn), copper (Cu), and zinc (Zn).

In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 112 may be formed of copper (Cu) having high electrical conductivity and a relatively low cost.

The circuit pattern 112 may be formed by a general process of manufacturing a PCB, such as an additive process, a subtractive process, a modified semi additive process (MSAP), a semi additive process (SAP), etc., and detailed descriptions thereof will be omitted herein.

Meanwhile, a buffer layer may be disposed between the insulating layer 111 and the circuit pattern 112. In detail, the buffer layer 200 may be disposed between the insulating layer 111 and the circuit pattern 112 to directly contact the insulating layer 111 and the circuit pattern 112.

The buffer layer 200 may improve adhesion between the insulating layer 111 and the buffer layer 200, and the buffer layer 200 will be described in detail below.

At least one via 113 is formed in the insulating layer 111. The via 113 is disposed to be passing through at least one of the plurality of insulating layers 111. The via 113 may pass through only one of the plurality of insulating layers 111, and alternatively, may be formed to commonly pass through at least two insulating layers of the plurality of insulating layers 111. Accordingly, the via 113 electrically connects circuit patterns disposed at surfaces of different insulating layers to each other.

The via 113 may be formed by filling, with a conductive material, a through hole (not shown) passing through at least one of the plurality of insulating layers 111.

The through hole may be formed by any one of mechanical, laser, and chemical processing. When the through hole is formed by mechanical processing, a method such as milling, drilling and routing may be used. When the through hole is formed by laser processing, a method of UV or $CO_2$ laser may be used. And when the through hole is formed by chemical processing, the insulating layer 111 may be opened by using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the via 113 is formed by filling the inside of the through hole with a conductive material. The metal material forming the via 113 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

The first pad 120 is disposed on the insulating layer disposed at the uppermost portion of the plurality of insulating layers 111 and the second pad 140 is disposed under the insulating layer disposed at the lowermost portion of the plurality of insulating layers 111.

In other words, the first pad 120 is disposed on the uppermost insulating layer 111 in which the electronic component 190 is to be formed, among the plurality of insulating layers 111. The first pad 120 may be formed in plural on the uppermost insulating layer. In addition, a part of the first pad 120 may serve as a pattern for signal transmission and the other part thereof may serve as an inner lead electrically connected to the electronic component 190 through the wire and the like. In other words, the first pad 120 may include a wire-bonding pad for wire bonding.

In addition, the second pad 140 is disposed under the lowermost insulating layer to which an external substrate (not shown) is to be attached, among the plurality of insulating layers 111. Like the first pad 120, a part of the second pad 140 also serves as a pattern for signal transmission, and the other part thereof may serve as an outer lead in which the adhesive member 175 is disposed for attachment of the external substrate. In other words, the second pad 140 includes a soldering pad for soldering.

In addition, the first upper metal layer 130 is disposed on the first pad 120 and the second upper metal layer 150 is disposed under the second pad 140. The first upper metal layer 130 and the second upper metal layer 150 are formed of the same material and increase characteristics of the wire bonding or soldering while protecting the first pad 120 and the second pad 140, respectively.

To this end, the first upper metal layer 130 and the second upper metal layer 150 are formed of a metal including gold (Au). Preferably, the first upper metal layer 130 and the second upper metal layer 150 may include pure gold (purity of 99% or more) only, or may be formed of an alloy including gold (Au). When the first upper metal layer 130 and the second upper metal layer 150 are formed of an alloy including gold, the alloy may be formed of a gold alloy including cobalt.

The solder paste 180 is disposed at the uppermost insulating layer among the plurality of insulating layers. The solder paste is an adhesive for fixing the electronic component 190 attached to the insulating substrate 110. Accordingly, the solder paste 180 may be defined to as an adhesive. The adhesive may be a conductive adhesive, or alternatively, the adhesive may be a non-conductive adhesive. That is, the printed circuit board 100 may be a substrate to which the electronic component 190 is attached in a wire-bonding manner, so that a terminal (not shown) of the electronic component 190 may not be disposed on the adhesive. In addition, the adhesive may not be electrically connected to the electronic component 190. Therefore, a non-conductive adhesive may be used as the adhesive, or alternatively, a conductive adhesive may be used as the adhesive.

The conductive adhesive is largely classified into an anisotropic conductive adhesive and an isotropic conductive adhesive, and is basically composed of conductive particles such as Ni, Au/polymer, or Ag, and thermosetting and thermoplastic resins, or a blend type insulation resin mixing characteristics of the two resins.

In addition, the non-conductive adhesive may also be a polymeric adhesive and may preferably be a non-conductive polymer adhesive including a thermosetting resin, a thermoplastic resin, a filler, a curing agent, and a curing accelerator.

Further, the first passivation layer 160, through which at least a part of a surface of the first upper metal layer 130 is exposed, is disposed on the uppermost insulating layer. The first passivation layer 160 is disposed to protect the surface of the uppermost insulating layer, and, for example, may be a solder resist.

In addition, the solder paste 180 is disposed on the first upper metal layer 130 so that the first pad 120 and the electronic component 190 may be electrically connected to each other.

Here, the electronic component 190 may include both a device and a chip. The device may be classified into an active device and a passive device. The active device refers to a device that positively uses non-linear characteristics.

The passive device refers to a device that does not use non-linear characteristics even though both linear and non-linear characteristics are present. In addition, the active device may include a transistor, an IC semiconductor chip, and the like and the passive device may include a condenser, a resistor, an inductor, and the like. The passive device is mounted on a substrate together with an ordinary semiconductor package in order to increase a signal processing speed of a semiconductor chip which is an active device, perform a filtering function, or the like.

As a result, the electronic component 190 may include all of a semiconductor chip, a light emitting diode chip, and other driving chips.

In addition, a resin molding part may be formed on the uppermost insulating layer, and accordingly, the electronic component 190 and the first upper metal layer 130 may be protected by the resin molding part.

Meanwhile, the second passivation layer 170 is disposed under the lowermost insulating layer among the plurality of insulating layers. The second passivation layer 170 has an opening exposing a surface of the second upper metal layer 150. The second passivation layer 170 may be formed of a solder resist.

As described earlier, the buffer layer may be disposed between the insulating layer 111 and the circuit pattern 112.

Hereinafter, a circuit board and a method of manufacturing the same according to the first embodiment will be described with reference to FIGS. 2 to 10.

Referring to FIG. 2, the buffer layer 200 may be disposed between the insulating layer 111 and the circuit pattern 112 in a region where the insulating layer 111 and the circuit pattern 112 overlap. In detail, the buffer layer 200 may be disposed on all surfaces of the insulating layer 100 on which the circuit pattern 112 is disposed.

The buffer layer 200 may be a surface treatment layer treated on the surface of the insulating layer 111. The buffer layer 200 may be an intermediate layer disposed between the insulating layer and the circuit pattern. The buffer layer 200 may be a coating layer disposed between the insulating layer and the circuit pattern. The buffer layer 200 may be a functional layer that improves adhesion between the insulating layer and the circuit pattern, that is, an adhesion strengthening layer.

Referring to FIG. 2, the buffer layer 200 may be disposed on the surface of the insulating layer 111. That is, the buffer layer 200 may be disposed on the surface of the insulating layer 111 on which the circuit pattern 1120 is disposed. The buffer layer 200 may be disposed on the surface of the insulating layer 111 except for vias.

The buffer layer 200 may be formed to have a constant thickness. In detail, the thickness T1 of the buffer layer 200 may be smaller than the thickness of the circuit pattern.

In detail, the circuit pattern 112 may include a plurality of layers. For example, the circuit pattern 112 may include a first layer 112a and a second layer 112b. The first layer 112a may be a seed layer constituting the circuit pattern 112. The first layer 112a may be formed through electroless plating using a metal material such as copper (Cu). That is, the first layer 112a may be a first plating layer.

In addition, the second layer 112b may be a second plating layer disposed on the first layer 112a. That is, the second layer 112b may be a second plating layer grown by electroplating the first layer 112a as a seed layer.

A thickness T2 of the first layer 112a may be smaller than a thickness T3 of the second layer 112b. In detail, the thickness T2 of the first layer 112a may be 0.7 μm to 2 μm, and the thickness T3 of the second layer 112b may be 10 μm to 25 μm.

A thickness T1 of the buffer layer may be smaller than the thickness of the first layer 112a and the second layer 112b.

For example, the thickness T1 of the buffer layer may be smaller than the thickness T2 of the first layer 112a. In detail, the thickness T1 of the buffer layer may be 1% to 50% of the thickness T2 of the first layer 112a. For example, the thickness T1 of the buffer layer may be 10 nm to 1 μm.

When the thickness (T1) of the buffer layer is less than 1% with respect to the thickness (T2) of the first layer (112a), it is difficult to implement the adhesion effect by the buffer layer, and when the thickness T1 of the buffer layer exceeds 50% of the thickness T2 of the first layer 112a, the overall thickness of the circuit board may be increased by the buffer layer.

The buffer layer 200 may include a plurality of elements. A plurality of elements included in the buffer layer 200 may be combined with each other in the buffer layer to be included in molecular or ionic form, and the molecules and the molecule or the ion may be chemically bonded to each other to form a buffer layer.

The buffer layer 200 may include at least one of a carbon element, a nitrogen element, and an oxygen element. In detail, the buffer layer 200 may include all of a carbon element, a nitrogen element, and an oxygen element.

The carbon element, nitrogen element, and oxygen element may be present in a molecular form by bonding to each other in the buffer layer or may exist in the form of a single ion in the buffer layer.

Among the plurality of elements, the oxygen element, the carbon element, and the nitrogen element may be related to a functional group of the buffer layer coupled to the insulating layer. That is, the functional group formed by the molecules including the oxygen element, the carbon element, the nitrogen atom, etc. may be chemically bonded to the insulating layer and the circuit pattern.

To this end, the carbon element, the nitrogen element, and the oxygen element may be included in a constant mass ratio. For example, the carbon element may be included in a mass ratio greater than that of the nitrogen element and the oxygen element. In addition, the carbon element may be included in a mass ratio greater than the sum of the nitrogen element and the oxygen element. In addition, the mass ratio of the oxygen element may be greater than or equal to the mass ratio of the nitrogen element.

In detail, a ratio of the nitrogen element to the carbon element ((carbon element/nitrogen element)*100) may be 5 to 15. In addition, a ratio of the oxygen element to the carbon element ((carbon element/oxygen element)*100) may be 15 to 30.

A ratio of the carbon element, nitrogen element, and oxygen element to the metal element may be related to a bonding strength of the insulating layer or the circuit board.

In detail, the ratio of the nitrogen element to the carbon element ((carbon element/nitrogen element)*100) does not satisfy 5 to 15, or the ratio of the oxygen element to the carbon element ((carbon element/oxygen element)*100) does not satisfy 15 to 30, the bonding force between the buffer layer and the circuit board and/or the buffer layer and the insulating layer is weakened, thereby reducing the adhesion between the circuit board and the insulating layer.

The carbon element, the oxygen element, and the nitrogen element may be chemically bonded to each other to form a plurality of functional groups in the buffer layer 200.

In detail, the buffer layer 200 may include a plurality of functional groups chemically bonded to the insulating layer 111 and the circuit pattern 112. In detail, the functional group of the buffer layer 200 may be coupled to at least one of the insulating layer 111 and the circuit pattern 112 by coordinate bonding.

For example, the buffer layer 200 may include at least one functional group selected from an amine group, a cyanide group, and a hydroxyl group, and the functional groups may be chemically bonded with at least one of the insulating layer 111 and the circuit pattern 112 through coordinate bonding.

That is, the buffer layer 200 has a structure in which at least one functional group of the amine group, cyanide group, and hydroxyl group is connected to a benzene ring, and the buffer layer 200, the insulating layer 111 and the circuit pattern 112 may be chemically bonded by the functional group.

Accordingly, adhesion between the insulating layer 111 and the circuit pattern 112, which are different materials, may be secured by the buffer layer 200 disposed between the insulating layer 111 and the circuit pattern 112.

That is, in the circuit board according to the first embodiment, adhesion between the insulating layer and the circuit pattern may be improved by the buffer layer disposed between the insulating layer and the circuit pattern. That is, since the buffer layer is chemically bonded to the insulating layer and the circuit pattern through coordinate bonding, adhesion between the insulating layer and the circuit pattern may be improved.

Accordingly, when the circuit pattern is formed on the insulating layer, the spacing and line width of the circuit pattern may be reduced. That is, since the adhesion between the circuit pattern and the insulating layer is improved, even if the spacing and line width of the circuit pattern are reduced, the supporting force of the circuit pattern can be secured, and thus the spacing and line width of the circuit pattern can be reduced.

Accordingly, the circuit board according to the first embodiment can reduce the spacing and line width of the circuit patterns, and thus the density of the circuit board can be improved.

FIGS. 3 to 10 are views for explaining a manufacturing process of the circuit board according to the first embodiment.

Figure 3:
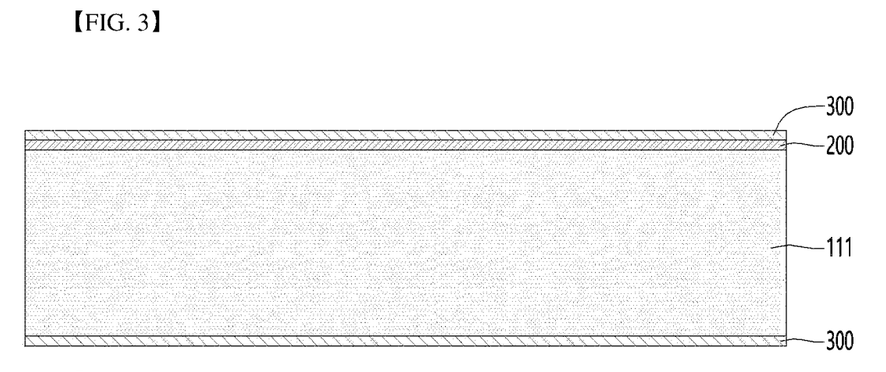
FIGS. 3 to 10 are views for explaining a process of forming a circuit pattern of the circuit board according to the first embodiment.

Referring to FIG. 3, first, the insulating layer 111 may be prepared. The buffer layer 200 and a metal layer 300 may be disposed on the insulating layer 111. For example, the buffer layer 200 may be disposed on at least one of both surfaces of the insulating layer 111, and the metal layer including copper or the like may be disposed on both surfaces of the insulating layer 111.

Figure 4:
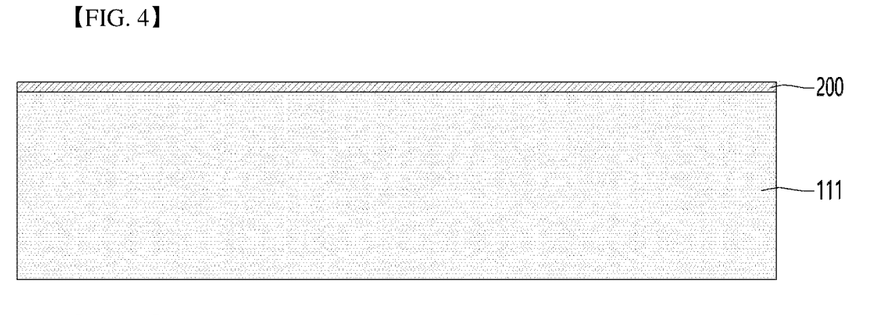

Next, referring to FIG. 4, the metal layer may be removed from the insulating layer 111. In detail, the metal layer 300 disposed on both surfaces of the insulating layer 111 may be removed from the insulating layer 111. For example, the metal layer 300 may be removed from the insulating layer 111 by mechanical or chemical etching.

Accordingly, the buffer layer 200 may be exposed on the surface of the insulating layer 111.

Figure 5:
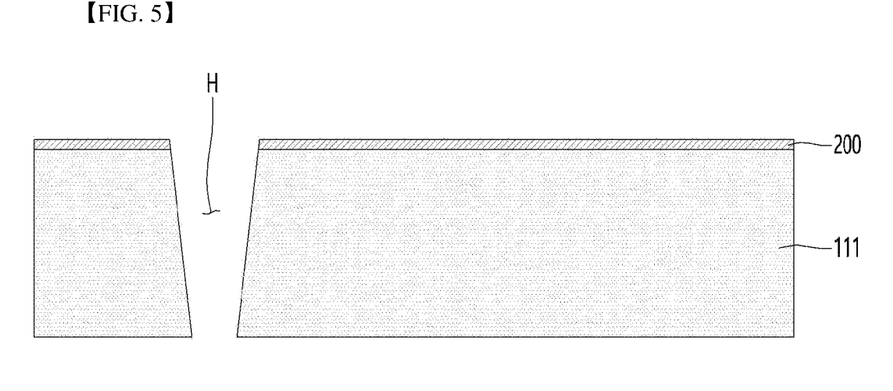

Next, referring to FIG. 5, a hole H may be formed in the insulating layer 111. The hole H may be formed through one surface and the other surface of the insulating layer 111 by machining or laser processing.

Accordingly, the buffer layer 200 may be disposed on the entire surface of the insulating layer 111 except for the region where the hole H is formed.

Figure 6:
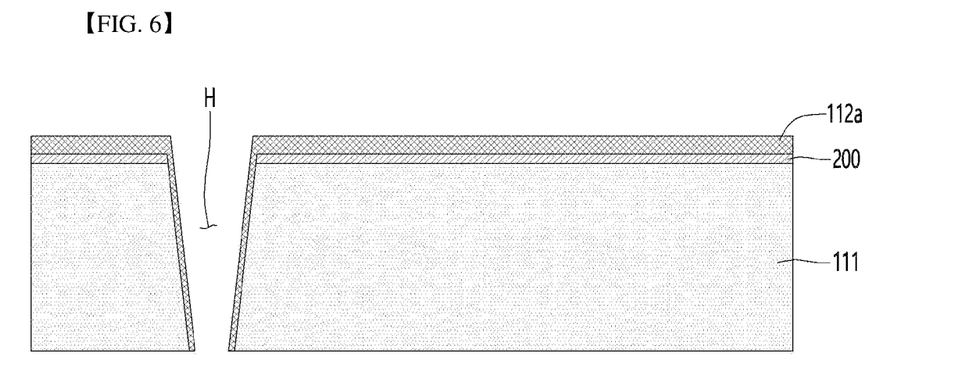

Next, referring to FIG. 6, a first layer 112a constituting a circuit pattern may be formed on the surface of the insulating layer 111. For example, a thin film layer including a copper (Cu) metal may be formed on the buffer layer 200 disposed on the insulating layer 111.

The first layer 112a may be disposed to have a thin film thickness of 0.7 μm to 2 μm through an electroless plating process. The first layer 112a may be disposed on the surface of the insulating layer 111 and on the inner surface of the hole H formed in the insulating layer 111.

Figure 7:
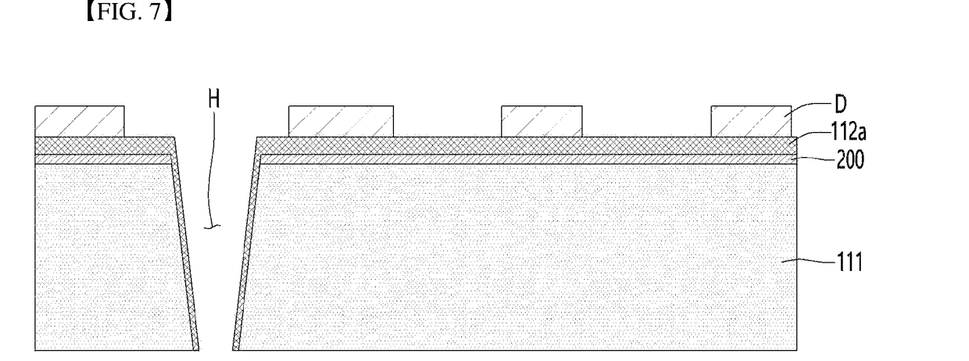

Next, referring to FIG. 7, a photosensitive film D may be disposed on the first layer 112a. In detail, after disposing the photosensitive film D on the entire surface of the first layer 112a, exposure, development, and etching processes may be performed to form the photosensitive pattern.

Accordingly, the photosensitive pattern may be disposed in an area other than the area where the circuit pattern is disposed.

Figure 8:
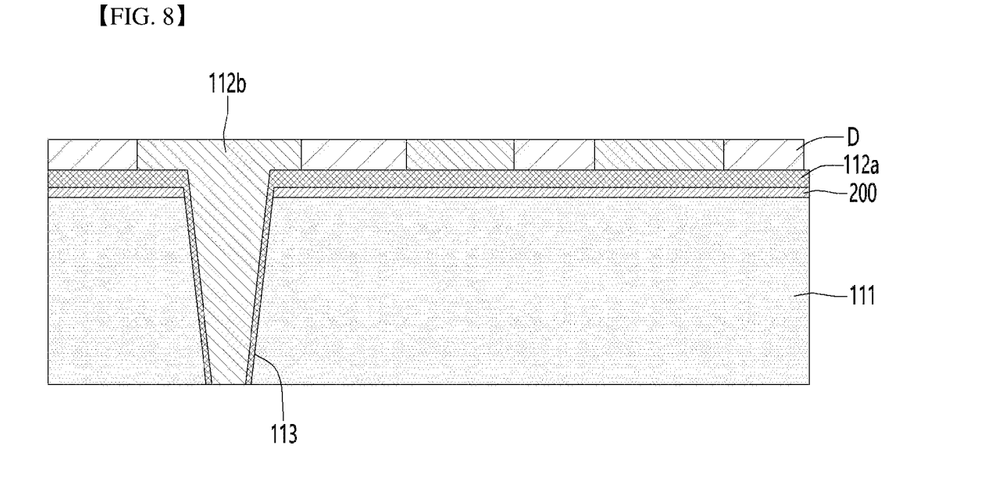

Next, referring to FIG. 8, a second layer 112b may be formed between the photosensitive patterns. In detail, a circuit pattern may be formed by forming the second layer 112b having a thickness of 10 μm to 25 μm through electrolytic plating on the first layer 112a.

In addition, as the second layer 112b is formed while filling the inside of the hole H, a via hole 113 of the circuit board may be formed.

Figure 9:
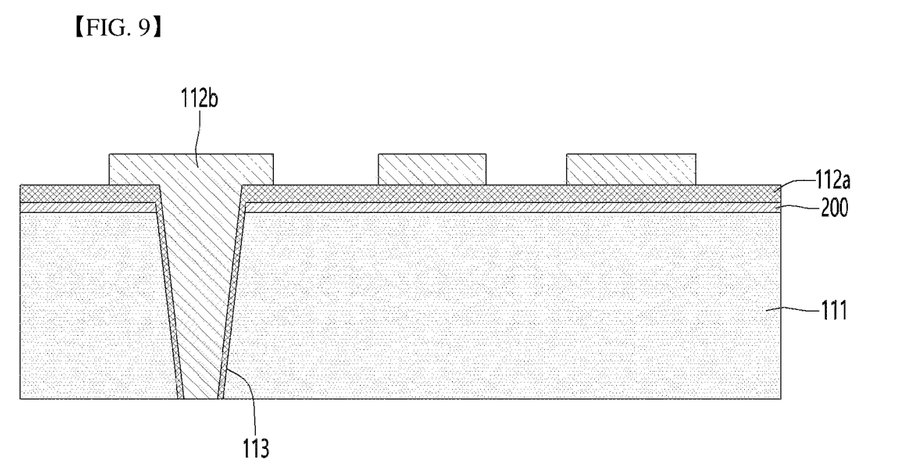
Figure 10:
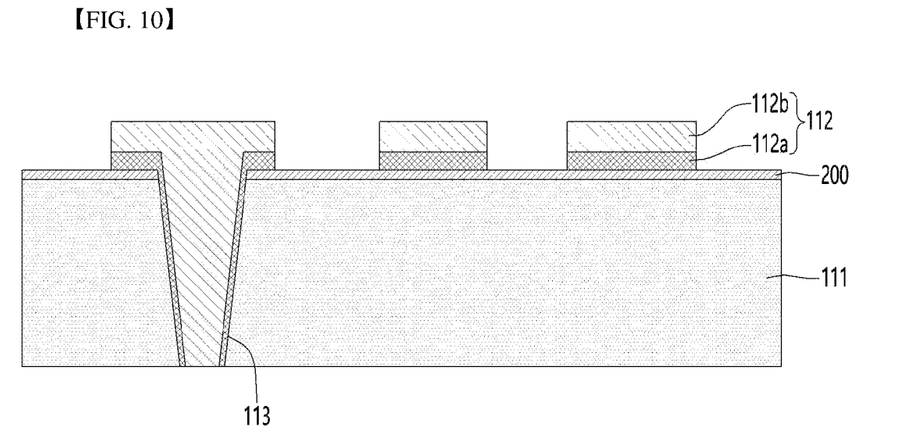

Next, referring to FIGS. 9 and 10, the photosensitive film D and the first layer 112a on the insulating layer 111 may be partially removed.

In detail, after removing the photosensitive film D disposed between the second layer (112b) as shown in FIG. 9, the first layer 111a remaining in the region from which the photosensitive film D is removed may be etched as shown in FIG. 10.

Accordingly, a plurality of circuit patterns 112 including the first layer 111a and the second layer 112b and disposed to be spaced apart from each other may be formed.

Hereinafter, a circuit board and a method of manufacturing the same according to a second embodiment will be described with reference to FIGS. 11 to 19. In the description of the circuit board according to the second embodiment, a description similar to the circuit board according to the first embodiment described above will be omitted. In addition, in the description of the circuit board according to the second embodiment, the same reference numerals are assigned to the same components as those of the first embodiment described above.

Figure 11:
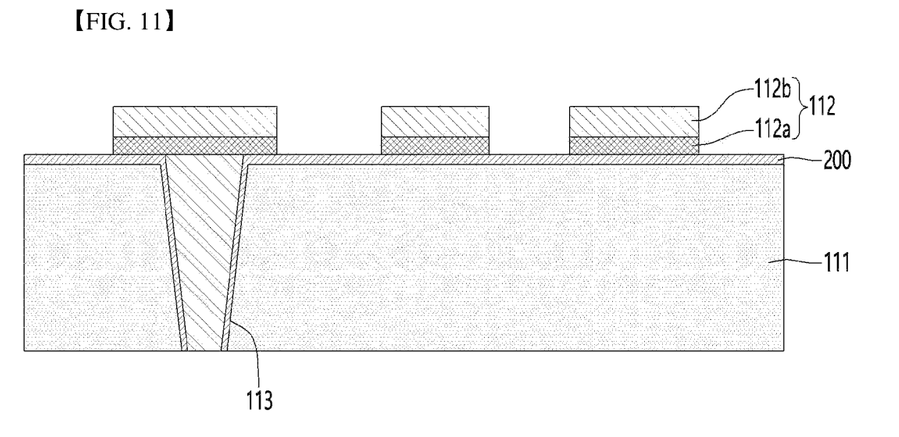
FIG. 11 is a cross-sectional view of one region of the circuit board according to the second embodiment.

Referring to FIG. 11, in the circuit board according to the second embodiment, a buffer layer 200 may be disposed on the insulating layer 111.

Unlike the circuit board according to the first embodiment described above, in the circuit board according to the second embodiment, the buffer layer 200 may also be disposed on the via 113. That is, the buffer layer 200 may be disposed on the surface of the insulating layer 111 and the inner surface of the via 113.

That is, the buffer layer 200 may be disposed on the entire surface of the insulating layer 111 on which the circuit pattern 112 is disposed and on the inner surface of the via 113 penetrating through the insulating layer 111.

Accordingly, in the circuit board according to the second embodiment, not only the circuit pattern 112 but also the conductive material disposed in the via may be disposed in contact with the buffer layer.

Accordingly, since the conductive material, which is the same material as the circuit pattern, is also chemically bonded to the functional group of the buffer layer, adhesion between the conductive material and the insulating layer in the via may be improved.

Hereinafter, a circuit board manufacturing method according to the second embodiment will be described with reference to FIGS. 12 to 19.

Figure 12:
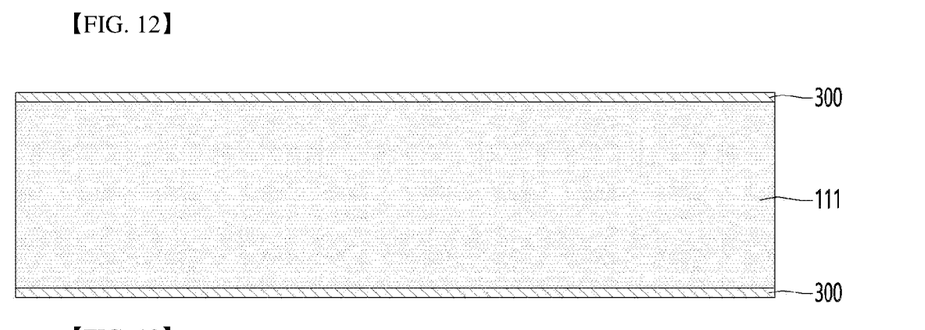
FIGS. 12 to 19 are views for explaining a process of forming a circuit pattern of the circuit board according to the second embodiment.

Referring to FIG. 12, first, the insulating layer 111 may be prepared. A metal layer 300 may be disposed on the insulating layer 111. In detail, the metal layer 300 including copper or the like may be disposed on both surfaces of the insulating layer 111.

Figure 13:
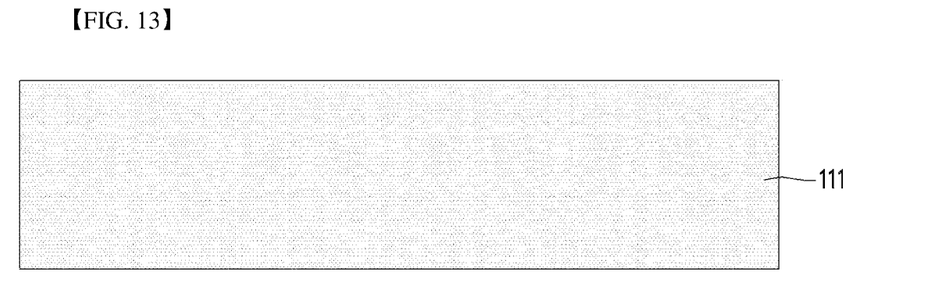

Next, referring to FIG. 13, the metal layer may be removed from the insulating layer 111. In detail, the metal layer 300 disposed on both surfaces of the insulating layer 111 may be removed from the insulating layer 111. For example, the metal layer 300 may be removed from the insulating layer 111 by mechanical or chemical etching.

Figure 14:
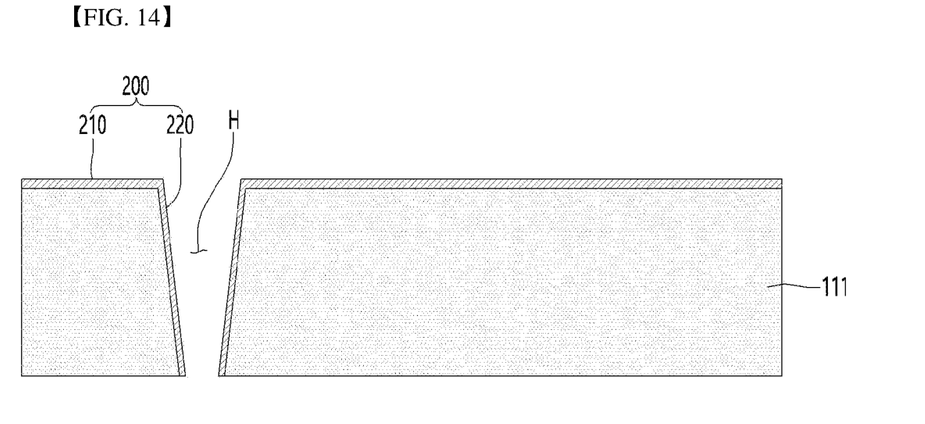

Next, referring to FIG. 14, a hole H may be formed in the insulating layer 111. The hole H may be formed through one surface and the other surface of the insulating layer 111 by machining or laser processing.

Next, the buffer layer 200 may be disposed on the insulating layer 111. In detail, the buffer layer 200 may include a first buffer layer 210 disposed on the surface of the insulating layer 111 and a second buffer layer 220 disposed on the inner surface of the hole H.

The first buffer layer 210 and the second buffer layer 220 may be disposed to be connected to each other. The first buffer layer 210 and the second buffer layer 220 may be integrally formed.

Figure 15:
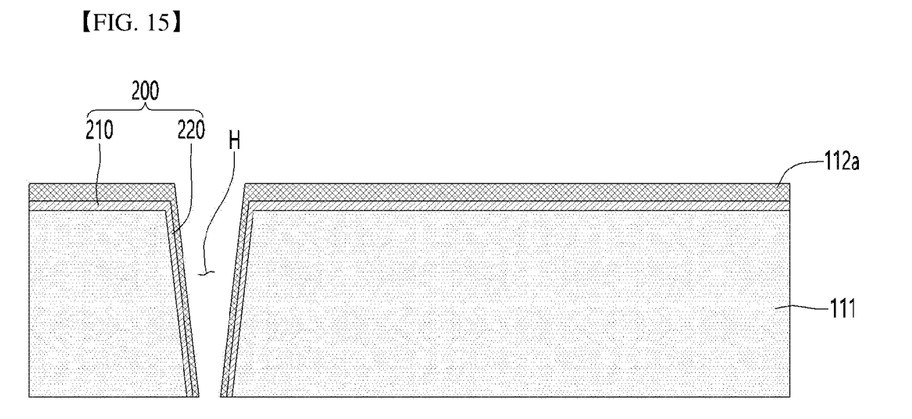

Next, referring to FIG. 15, the first layer 112a constituting a circuit pattern may be formed on the surface of the insulating layer 111. For example, a thin film layer including a copper (Cu) metal may be formed on the buffer layer 200 disposed on the insulating layer 111.

The first layer 112a may be disposed to have a thin film thickness of 0.7 μm to 2 μm through an electroless plating process. The first layer 112a may be disposed on the surface of the insulating layer 111 and on the inner surface of the hole H formed in the insulating layer 111.

As the buffer layer is also disposed on the inner surface of the hole H, the first layer 112a may be disposed in direct contact with the buffer layer on both the surface of the insulating layer and the inner surface of the vias.

Figure 16:
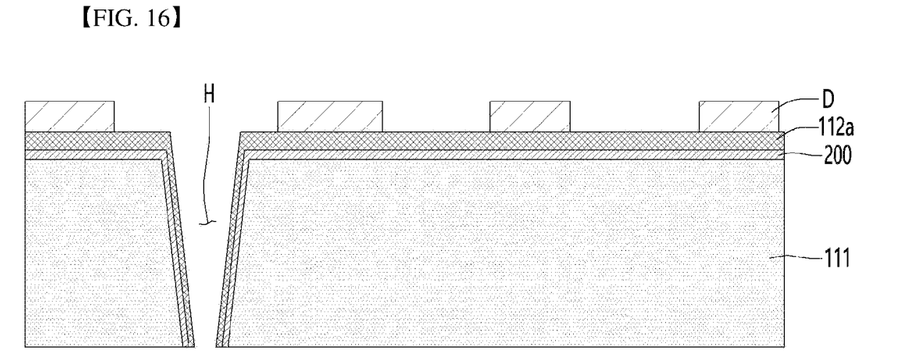

Next, referring to FIG. 16, a photosensitive film D may be disposed on the first layer 112a. In detail, after disposing the photosensitive film D on the entire surface of the first layer 112a, exposure, development, and etching processes may be performed to form the photosensitive pattern.

Figure 17:
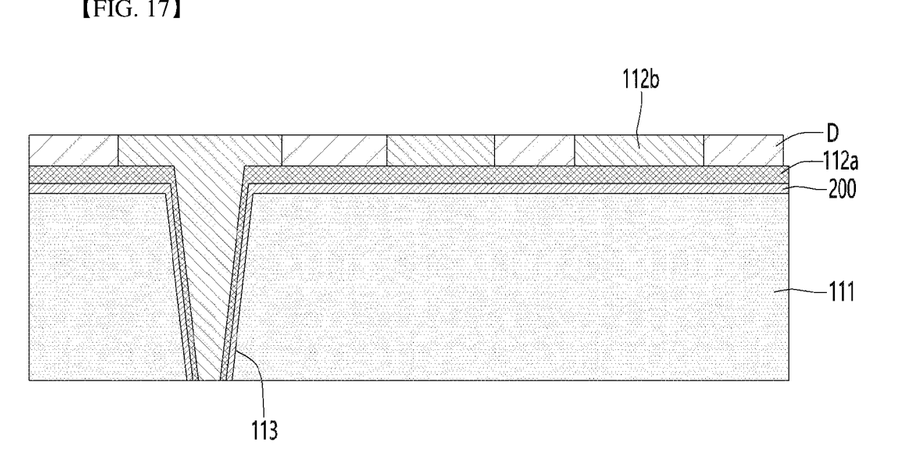

Next, referring to FIG. 17, the second layer 112b may be formed between the photosensitive patterns. In detail, the circuit pattern may be formed by forming the second layer 112b having a thickness of 10 μm to 25 μm through electrolytic plating on the first layer 112a.

In addition, as the second layer 112b is formed while filling the inside of the hole H, a via hole 113 of the circuit board may be formed.

Figure 18:
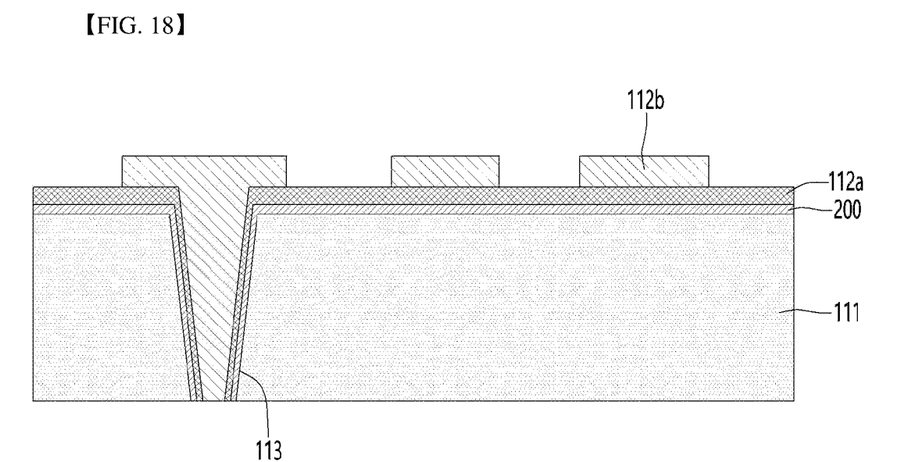

Next, referring to FIGS. 17 and 18, the photosensitive film D and the first layer 112a on the insulating layer 111 may be partially removed.

Figure 19:
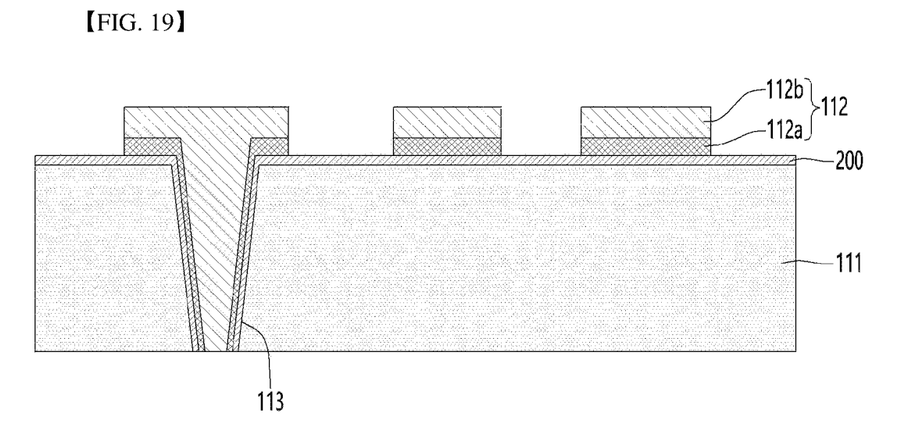

In detail, after removing the photosensitive film D disposed between the second layers 112b as shown in FIG. 18, the first layer 111a remaining in the region from which the photosensitive film D is removed may be etched as shown in FIG. 19.

Accordingly, a plurality of circuit patterns 112 including the first layer 111a and the second layer 112b and disposed to be spaced apart from each other may be formed.

The circuit board according to the embodiment may improve adhesion between the insulating layer and the circuit pattern. In detail, the adhesion between the first layer formed of copper among the plating layers of the circuit pattern and the insulating layer may be improved.

Accordingly, the spacing and line width of the circuit pattern may be reduced.

That is, even if the spacing or line width of the circuit pattern is reduced, the support force of the circuit pattern can be secured by the adhesion between the first layer of the circuit pattern and the insulating layer, thereby the circuit pattern having a fine line width and a fine spacing can be implemented.

Accordingly, since the circuit pattern according to the embodiment may improve the density of the circuit pattern, more circuit patterns may be disposed in the same area and the size of the circuit pattern may be reduced.

The characteristics, structures and effects described in the embodiments above are included in at least one embodiment but are not limited to one embodiment. Furthermore, the characteristics, structures, effects, and the like illustrated in each of the embodiments may be bonded or modified even with respect to other embodiments by those of ordinary skill in the art to which the embodiments pertain. Thus, it would be construed that the contents related to such a combination and such a modification are included in the scope of the embodiments.

In addition, the above description has been focused on the embodiments, but it is merely illustrative and does not limit the present invention. Those skilled in the art to which the embodiments pertain may appreciate that various modifications and applications not illustrated above are possible without departing from the essential features of the embodiment. For example, each component particularly represented in the embodiments may be modified and realized. In addition, it should be construed that differences related to such a modification and an application are included in the scope of the present invention defined in the appended claims.

The invention claimed is:

1. A circuit board comprising:
   an insulating layer;
   a circuit pattern disposed on an upper surface or under a lower surface of the insulating layer; and
   a buffer layer disposed on at least one of on the upper surface and under the lower surface of the insulating layer,
   wherein the buffer layer includes carbon element, nitrogen element and oxygen element,
   wherein a ratio of the nitrogen element to the carbon element ((carbon element/nitrogen element)*100) is 5 to 15,
   wherein a ratio of the oxygen element to the carbon element ((carbon element/oxygen element)*100) is 15 to 30,
   wherein the buffer layer includes a functional group which is coordinate bond with at least one of the insulating layer and the circuit pattern.

2. The circuit board of claim 1, wherein the functional group includes at least one of an amine group, a cyanide group, and a hydroxyl group.

3. The circuit board of claim 1, wherein the circuit pattern may include a first layer on the insulating layer; and a second layer on the first layer, wherein a thickness of the buffer layer is smaller than s thickness of the first layer.

4. The circuit board of claim 3, wherein the thickness of the buffer layer is 1% to 50% of the thickness of the first layer.

5. The circuit board of claim 1, wherein the buffer layer is in direct contact with the insulating layer and the circuit pattern.

6. The circuit board of claim 1, wherein the buffer layer is disposed on the entire surface of the insulating layer on which the circuit pattern is disposed.

7. The circuit board of claim 1, wherein the circuit pattern includes copper.

8. The circuit board of claim 1, wherein a thickness of the buffer layer is 10 nm to 1 μm.

9. A circuit board comprising:
an insulating layer comprising a via;
a circuit pattern disposed on an upper surface or under a lower surface of the insulating layer; and
a buffer layer disposed on at least one of on the upper surface of the insulating layer, under the lower surface of the insulating layer and on an inner surface of the via,
wherein the buffer layer includes carbon element, nitrogen element and oxygen element,
wherein a ratio of the nitrogen element to the carbon element ((carbon element nitrogen element)*100) is 5 to 15,
wherein a ratio of the oxygen element to the carbon element ((carbon element/oxygen element)*100) is 15 to 30,
wherein the buffer layer includes a functional group which is coordinate bond with at least one of the insulating layer and the circuit pattern.

10. The circuit board of claim 9, wherein the buffer layer includes a first buffer layer disposed on the upper surface of the insulating layer and a second buffer layer disposed on the inner surface of the via,
wherein the first buffer layer and the second buffer layer are integrally formed.

11. The circuit board of claim 9,
wherein the functional group includes at least one of an amine group, a cyanide group, and a hydroxyl group.

12. The circuit board of claim 9, wherein the circuit pattern may include a first layer on the insulating layer; and a second layer on the first layer,
wherein the thickness of the buffer layer is 1% to 50% of the thickness of the first layer.

13. The circuit board of claim 9, wherein the buffer layer is in direct contact with the insulating layer and the circuit pattern.

14. The circuit board of claim 9, wherein the buffer layer is disposed on the entire surface of the insulating layer on which the circuit pattern is disposed.

15. The circuit board of claim 9, wherein a thickness of the buffer layer is 10 nm to 1 μm.

* * * * *